United States Patent [19]

Mori

[11] Patent Number: 5,051,794

[45] Date of Patent: Sep. 24, 1991

[54] NON-VOLATILE SEMICONDUCTOR MEMORY DEVICE AND METHOD FOR MANUFACTURING THE SAME

[75] Inventor: Seiichi Mori, Tokyo, Japan

[73] Assignee: Kabushiki Kaisha Toshiba, Kanagawa, Japan

[21] Appl. No.: 374,788

[22] Filed: Jul. 3, 1989

[30] Foreign Application Priority Data

Jul. 5, 1988 [JP] Japan .................................. 63-167608

[51] Int. Cl.⁵ ............................................ H01L 29/68
[52] U.S. Cl. .................................... 357/235; 357/23.3; 357/23.8
[58] Field of Search ...................... 357/23.5, 23.3, 23.4, 357/54, 23.8

[56] References Cited

U.S. PATENT DOCUMENTS 4,794,565 12/1988 Wu et al. ............................ 357/23.5
4,878,101 10/1989 Hsieh et al. ........................ 357/23.5

FOREIGN PATENT DOCUMENTS 62-160770 7/1987 Japan .................................. 357/23.3

OTHER PUBLICATIONS

IEDM Technical Digest; Chi Chang and Jih Lien; Dec. 6, 1987.

Primary Examiner—Andrew J. James
Assistant Examiner—Courtney A. Bowers
Attorney, Agent, or Firm—Finnegan, Henderson, Farabow, Garrett, and Dunner

[57] ABSTRACT

A non-volatile semiconductor memory device such as EPROM or EEPROM includes floating and control gates. Thick oxide portions are formed at each end of the floating gate, and the thickness of the thick oxide portion adjacent to a drain region is thicker than that of the thick oxide portion adjacent to a source region.

7 Claims, 2 Drawing Sheets

NON-VOLATILE SEMICONDUCTOR MEMORY DEVICE AND METHOD FOR MANUFACTURING THE SAME

BACKGROUND OF THE INVENTION

This invention relates to a non-volatile semiconductor memory device having a floating gate and a control gate, and a method for manufacturing the same.

An ultra-violet erase type non-volatile memory (EPROM) has a memory cell, which is a MOS transistor with a floating gate and a control gate.

A memory cell of an EPROM in the prior art will be explained below with reference to FIG. 1.

N-type source and drain regions 118 and 119 are formed in the surface portions of a p-type silicon semiconductor substrate 111. A first SiO$_2$ layer 112 is formed on a channel region 122 between the source region 118 and the drain region 119. A floating gate 113 of poly-silicon is formed on the first SiO$_2$ layer 112.

A second SiO$_2$ layer 114, a silicon nitride layer 115 and a third SiO$_2$ layer 116 are formed in that order on the floating gate 113, and a control gate 117 of poly-silicon is formed on the third SiO$_2$ layer 116.

A fourth SiO$_2$ layer 120 is formed by thermal oxidation on a surface of the floating gate 113 and the control gate 117. During this thermal oxidation, thick oxide portions 120A and 120B are simultaneously formed at each end of the floating gate 113.

The operation of this memory cell is explained as follows.

By applying 12.5, 7 and 0 V to the control gate 117, the drain region 119 and the source region 118, hot electrons are generated and injected into the floating gate 113. Thus, data "0" is written into this memory cell.

By exposing this memory cell to ultra-violet rays, electrons are discharged from the floating gate 113. Therefore, data "1" is written into this memory cell.

The Tech Digest of IEDM, p. 714 and p. 721, 1987 teaches that a large leakage current flows from the edge of a drain region to a silicon substrate in a MOSFET type semiconductor device because of the thin gate oxide film in the device.

When electrons are present in a floating gate of an EPROM cell, such leakage current increases conspicuously because the potential of the floating gate is negative.

In the memory cell of FIG. 1, electrons in the floating gate can disappear and data may be destroyed. In this case, it is believed that holes are generated by this leakage current and are injected into the floating gate. In the memory cell of FIG. 1, such leakage current is suppressed by the thick oxide portions 120A and 120B.

In order to erase the data by exposing the memory cell to ultra-violet rays, electrons stored in the floating gate 113 are discharged to the source region 118 and the drain region 119 through the thick oxide portions 120A and 120B, and to the control gate 117.

The silicon nitride 115 formed for obtaining a dielectric constant extends in the length direction of the channel region 122 beyond the edge of the floating gate 113 and the control gate 117, and it is harder for electrons to pass through silicon nitride as compared with SiO$_2$.

Therefore, most of the electrons are discharged to the source region 118 and the drain region 119. However, such discharge to the source and drain regions arises at the edge portions of the floating gate, so that electrons pass through the thick oxide portions 120A and 120B during the erasing of data.

Moreover, the existence of thick oxide in source side 12a may lead to the increase of palasitic resistance and degradation of drivability for cell transistor.

Accordingly, in the prior art, there was a problem in that the speed of erasing data was reduced and current drivability of cell transistor may degrade because of the existence of the thick oxide portions 120A and 120B.

SUMMARY OF THE INVENTION

An object of this invention is to provide a non-volatile semiconductor memory device which can sufficiently suppress leakage current flowing from the drain region to the semiconductor substrate, and maintain the speed of erasing data and drivability of cell transistor.

Another object of this invention is to provide a method for manufacturing the above non-volatile semiconductor memory device.

A non-volatile semiconductor memory device according to this invention comprises a semiconductor substrate of one conductivity type, first and second regions of opposite conductivity type spaced apart from each other in the substrate, a channel region between the first and second regions, a first insulating layer on the channel region, including a first portion adjacent to the first region and a second portion adjacent to the second region, a floating gate on the first insulating layer, a second insulating layer on the floating gate, a control gate on the second insulating layer, the thickness of the second portion between the first region and the floating gate being greater than the thickness of the first portion between the second region and the floating gate.

A method of manufacturing a non-volatile semiconductor memory device according to this invention, the method comprising the steps of forming a first insulating layer on a semiconductor substrate, forming a first conductive layer on the first insulating layer, forming a second insulating layer on the first conductive layer, forming a second conductive layer on the second insulating layer, forming a resist pattern on the second conductive layer, etching the layers to form a control gate and a floating gate from the first and second conductive layers between the first and second insulating layers, forming a third insulating layer by oxidizing on the surface exposed of the substrate, the floating gate and the control gate and forming simultaneously a first and a second thick oxide portions at each and of the floating gate, forming a first and a second region of opposite conductivity type apart each other in the substrate by doping an impurity, thereby forming a channel region between the first and second regions, forming an anti-oxidation film pattern on a part of the third insulating layer adjacent to the first thick oxide portion, oxidizing a surface that is not covered with the anti-oxidation film pattern so as to make said second thick portion thicker than the first thick portion.

DETAILED DESCRIPTION OF THE PREFERRED EMBODIMENTS

Figure 1:
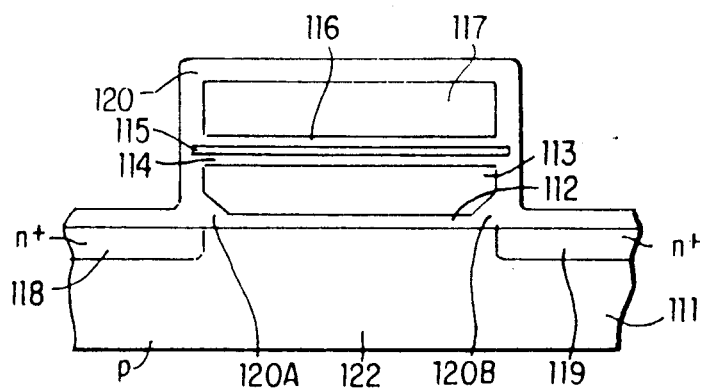
FIG. 1 is a cross sectional view in the channel-length direction of the memory cell of a prior art EPROM.
Figure 2:
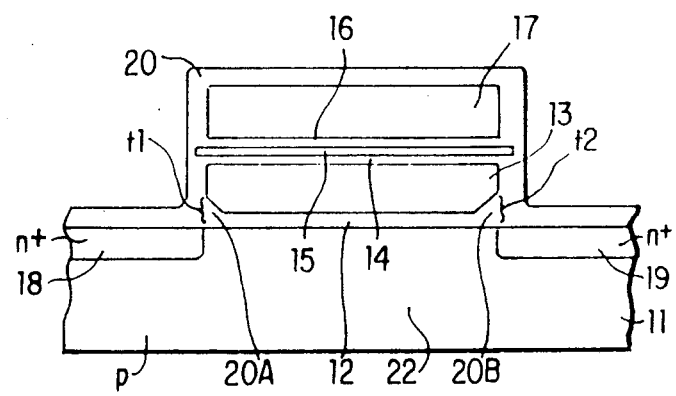
FIG. 2 is a cross sectional view in the channel-length direction of the memory cell of an EPROM according to one embodiment of this invention.
Figure 3A:
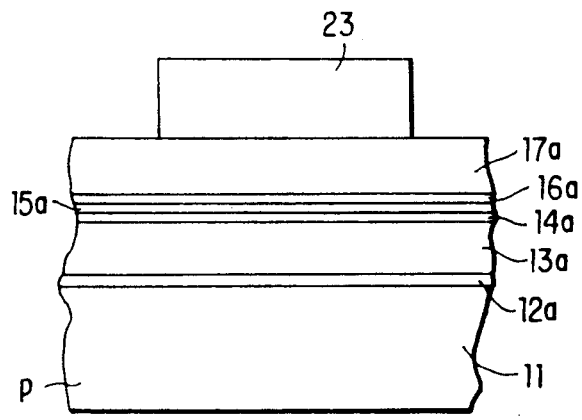
FIGS. 3A to 3E are cross sectional views in the channel-length direction of the EPROM according to one
Figure 3B:
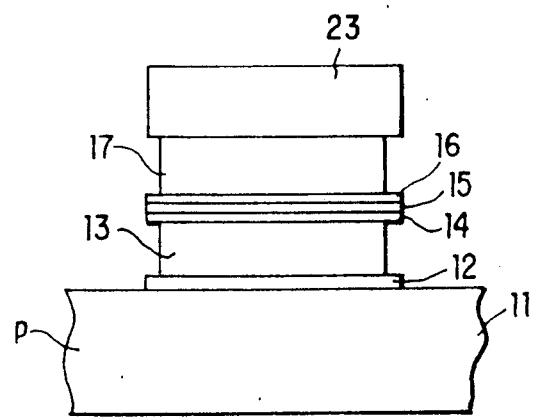
Figure 3D:
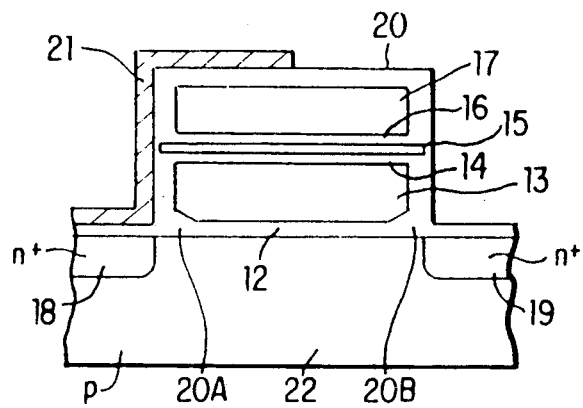
Figure 3C:
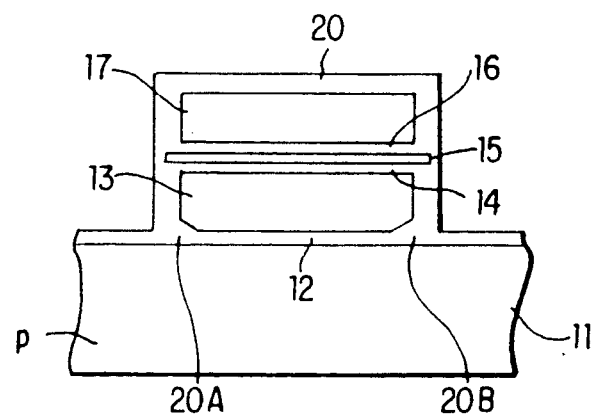
Figure 3E:
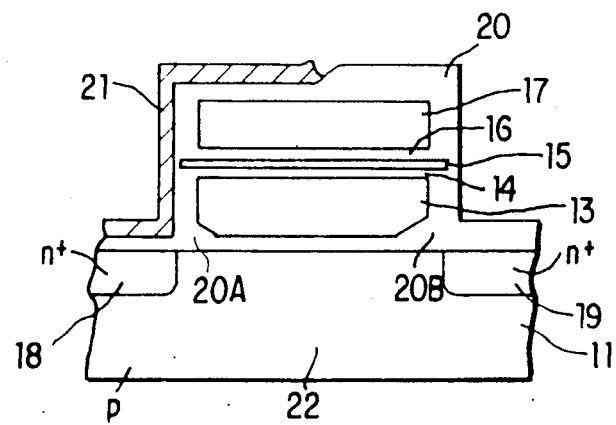

FIG. 2 shows an example of a memory cell (EPROM) according to one embodiment of this invention.

In FIG. 2, N-type source and drain regions 18 and 19 are formed in surface portions of a p-typesilicon semiconductor substrate 11. A first $SiO_2$ layer 12 is formed on the substrate 11 between the source region 18 and the drain region 19.

A floating gate 13 of poly-silicon is formed on the first $SiO_2$ layer 12. A second $SiO_2$ layer 14, a silicon nitride layer 15 and a third $SiO_2$ layer 16 are formed in that order on the floating gate 13, and a control gate 17 of poly-silicon is formed on the third $SiO_2$ layer 16.

A fourth $SiO_2$ layer 20 is formed by thermal oxidation on a the floating gate 13 and the control gate 17.

Portions 20A and 20B of the $SiO_2$ layer 20 are formed thicker than the first $SiO_2$ layer 12. The thickness(t2) of the thick oxide portion 20B is greater than that (t1) of the thick oxide portion 20A.

In this memory cell, the thickness of the "ONO" film of $SiO_2$ 14, silicon nitride 15, and $SiO_2$ 16 is thinner than that of an insulated film of only $SiO_2$. Thus, the dielectric constant of the "ONO" film is higher than that of an insulated film.

As the thick oxide portion 20A is thinner than the thick oxide portion 20B, a leakage current is suppressed by the thick oxide portion 20B and electrons are discharged effectively from the floating gate 13 to the source region 18 through the thick oxide portion 20A during erasing of data. Moreover, degradation of drivability for cell transistor due to the increase of palasitic resistance at source side can be minimized. Accordingly, the speed of erasing data by exposure to ultra-violet rays is short and current drivability is higher compared with the prior art.

This invention also may be applied to EEPROM devices (Electric Erasable Programable Read Only Memory).

The steps of manufacturing the embodiment of this invention will be explained below with reference to FIGS. 3A to 3E.

A $SiO_2$ layer 12a of about 200Å in thickness is formed on the substrate 11 by thermal oxidation. A poly-silicon layer 13a of about 2000Å in thickness is formed on the $SiO_2$ layer 12a by the CVD method. A $SiO_2$ layer 14a of about 200Å in thickness is formed on the poly-silicon 13a by thermal oxidation. A silicon nitride layer 15a of about 150Å in thickness is formed on the $SiO_2$ layer 14a by the LPCVD (low pressure chemical vapor deposition) method.

A $SiO_2$ layer 16a of about 60Å in thickness is formed on the silicon nitride layer 15a by thermal oxidation. A poly-silicon layer 17a of about 4000Å in thickness is formed by a CVD method on the $SiO_2$ layer 16a. A resist pattern 23 is formed on a predetermined portion of the poly-silicon layer 17a (see FIG. 3A).

With the resist pattern 23 as a mask, the poly-silicon layer 17a, the $SiO_2$ layer 16a, the silicon nitride layer 15a, the $SiO_2$ layer 14a, the poly-silicon layer 13a and the $SiO_2$ 12a are etched selectively by anisotropic etching, such as RIE (Reactive Ion Etching). Ends are formed with an overhang of about 500Å in the channel-length direction on the third $SiO_2$ layer 16, the silicon nitride layer 15, and the second $SiO_2$ layer 14, and on the first $SiO_2$ layer 12. Next, These ends are formed by isotropic etching of the control gate 17 and the floating gate 13 (see FIG. 3B).

A fourth $SiO_2$ layer 20 is formed on the whole surface by thermal oxidation. As a result, thick oxide portions 20A and 20B are formed at the ends of the floating gate 13 (see FIG. 3C).

N-type source and drain regions, 18 and 19, are formed apart from each other in the substrate 11 by arsenic doping. This forms a channel region between the source and the drain regions 18 and 19 below the first $SiO_2$ layer 12. A silicon nitride pattern 21 is formed so as to cover the portion of the fourth $SiO_2$ layer 20 adjacent to the source region 18 (see FIG. 3D).

The poly-silicon that is not covered With the silicon nitride pattern 21 is oxidized. Thus, a thick oxide portion 20C is formed adjacent to the drain region 19 and the thickness of the thick oxide portion 20C becomes thicker than that of the thick oxide portion 20A (see FIG. 3E). The silicon nitride then is removed.

It will be apparent to those skilled in the art that various modifications could be made in the invention without departing from the scope or spirit of the invention.

What is claimed is:

1. A non-volatile semiconductor memory device comprising:
    a semiconductor substrate of one conductivity type;
    first and second regions of opposite conductivity type with respect to said substrate and spaced apart from each other in said substrate;
    a channel region between said first and second regions;
    a first insulating layer including a first portion adjacent to said first region, a second portion adjacent to said second region and a third portion between said first and second portions, the thickness of said first portion being thicker than that of said third portion, and the thickness of said second portion being thicker than that of said first portion;
    a floating gate on said first insulating layer including said first, second and third portions;
    a second insulating layer on said floating gate; and
    a control gate on said second insulating layer.

2. The non-volatile semiconductor memory device according to claim 1, wherein said first and second regions are source and drain regions, respectively.

3. The non-volatile semiconductor memory device according to claim 1, wherein the floating gate and the control gate include poly-silicon.

4. The non-volatile semiconductor memory device according to claim 1, wherein said second insulating layer includes nitrogen.

5. The non-volatile semiconductor memory device according to claim 1, wherein said second insulating layer includes silicon nitride.

6. The non-volatile semiconductor memory device according to claim 1, wherein said second insulating layer includes a first $SiO_2$ layer on the floating gate, a silicon nitride layer on the first $SiO_2$ layer and a second $SiO_2$ layer on the silicon nitride layer.

7. The non-volatile semiconductor memory device according to claim 1, wherein the length of said silicon nitride layer in the channel-length direction of said channel region is greater than that of at least one of said floating and control gate.

* * * * *